United States Patent
Fujisawa et al.

(10) Patent No.: US 8,194,110 B2
(45) Date of Patent: Jun. 5, 2012

(54) IMAGE RECORDING APPARATUS FOR RECORDING AN IMAGE ON AN IMAGE RECORDING MEDIUM

(75) Inventors: Hiroyuki Fujisawa, Kyoto (JP); Keisuke Hirayama, Kyoto (JP); Hitoshi Shioda, Kyoto (JP); Hiroshi Okamoto, Kyoto (JP)

(73) Assignee: Dainippon Screen MFG Co., Ltd., Kyoto (JP)

( * ) Notice: Subject to any disclaimer, the term of this patent is extended or adjusted under 35 U.S.C. 154(b) by 702 days.

(21) Appl. No.: 12/299,892

(22) PCT Filed: Sep. 7, 2007

(86) PCT No.: PCT/JP2007/000975
§ 371 (c)(1),
(2), (4) Date: Nov. 6, 2008

(87) PCT Pub. No.: WO2008/032440
PCT Pub. Date: Mar. 20, 2008

(65) Prior Publication Data
US 2009/0179981 A1      Jul. 16, 2009

(30) Foreign Application Priority Data
Sep. 13, 2006  (JP) ................. 2006-248767

(51) Int. Cl.
*B41J 2/435* (2006.01)
(52) U.S. Cl. ...................................... 347/227
(58) Field of Classification Search ............... 347/224, 347/225, 238, 241, 242, 246, 257, 229, 234, 347/245, 262–264, 197, 227; 101/485, 486
See application file for complete search history.

(56) References Cited

U.S. PATENT DOCUMENTS

| | | | |
|---|---|---|---|
| 6,007,962 A | 12/1999 | Pearce et al. | |
| 6,371,026 B1 * | 4/2002 | Ben-Zion et al. | 101/483 |
| 6,624,840 B1 * | 9/2003 | Kawamura et al. | 347/264 |
| 7,146,911 B2 * | 12/2006 | Omoto et al. | 101/485 |
| 7,209,157 B2 * | 4/2007 | Isono et al. | 347/227 |
| 7,230,636 B2 * | 6/2007 | Iwasa et al. | 347/227 |
| 2005/0001894 A1 | 1/2005 | Isono et al. | |

FOREIGN PATENT DOCUMENTS

| | | |
|---|---|---|
| JP | 2000-056400 | 2/2000 |
| JP | 2001-022088 | 1/2001 |
| JP | 2005-010613 | 1/2005 |
| JP | 2005-335400 | 12/2005 |

OTHER PUBLICATIONS

European Search Report issued in European Patent Application No. EP 07805830.2 dated Jul. 13, 2009.

* cited by examiner

*Primary Examiner* — Hai C Pham
(74) *Attorney, Agent, or Firm* — McDermott Will & Emery LLP

(57) ABSTRACT

In an image recording apparatus using an image recording medium which generates a gas when irradiated with a light beam, the gas and the like are prevented from drifting into a space between the image recording medium and a drum, and thus contamination of the back surface of the image recording medium is prevented. The gas is effectively prevented from drifting to the back surface of a plate P by setting a relative positional relationship of an extending direction of each suction groove L, an attaching position of the plate P, and an air blowing direction so that unclosed regions, not closed by the plate P, of suction grooves L formed in a drum surface do not occur downstream in a gas moving direction.

6 Claims, 16 Drawing Sheets

IMAGE RECORDING APPARATUS FOR RECORDING AN IMAGE ON AN IMAGE RECORDING MEDIUM

RELATED APPLICATIONS

This application is the U.S. National Phase under 35 U.S.C. §371 of International Application No. PCT/JP2007/00975, filed on Sep. 7, 2007, which in turn claims the benefit of Japanese Application No. 2006-248767, filed on Sep. 13, 2006, the disclosures of which Applications are incorporated by reference herein.

TECHNICAL FIELD

This invention relates to an image recording apparatus for recording an image on an image recording medium mounted on a drum.

BACKGROUND ART

In an image recording apparatus for recording an image by irradiating an image recording medium with laser light to generate a gas of components of the image recording medium from the surface of the medium, the gas could adhere to an objective lens of a recording head and fog surfaces of the objective lens, thereby deteriorating the quality of an image formed on the image recording medium. Thus, an image recording apparatus has been proposed, as described in Patent Document 1, which produces an airflow in a direction to intersect the laser light emitted from the recording head, for diffusing the gas and preventing the gas from adhering to the objective lens of the recording head.

As described in Patent Document 2, for example, a recording drum for holding an image recording medium includes a suction mechanism in order to hold the image recording medium tight. Specifically, a vacuum pump is connected to a hollow recording drum having suction grooves and suction bores formed in the surface thereof, to generate a negative pressure on the recording drum surface, thereby fixing the image recording medium such as a printing plate or film to the recording drum surface. With the image recording apparatus having such a recording drum, while rotating the recording drum with the image recording medium fixed to the drum surface, the recording head is moved in a secondary scanning direction to form a two-dimensional image on the surface of the image recording medium.

With such apparatus, long grooves are formed circumferentially and axially of the recording drum surface, each groove having a suction bore formed in a predetermined location thereof and communicating with an inner chamber of the recording drum. In order to accommodate image recording media of different sizes, each groove has a sufficient length in the direction of extension.

[Patent Document 1] Unexamined Patent Publication No. 2000-056400

[Patent Document 2] Unexamined Patent Publication No. 2005-335400

DISCLOSURE OF THE INVENTION

Problem To Be Solved By The Invention

The conventional apparatus has a problem of contamination of the image recording medium caused by the gas, dust and the like generated by image recording and becoming involved in between the recording drum surface and the image recording medium. However, with the image recording medium used with the conventional apparatus, what is necessary is to solve only the contamination of the front surface of the image recording medium, i.e. the surface opposed to the recording head, and no concern has been given to contamination of the back surface of the image recording medium.

In recent years, a technique has been in practical use which forms a letterpress image directly on an image recording medium called flexo-digital plate by using a plate exposing apparatus designed for CTP (computer-to-plate) platemaking. It has become clear that, with the image recording medium such as a flexo-digital plate, the contamination of the back surface of the plate exerts a negative influence on the accuracy of image recording. The object of this invention, therefore, is to prevent a situation where the gas produced by image recording drifts to the back surface of an image recording medium and contaminates this surface.

Means For Solving The Problem

The image recording apparatus set out in claim 1 comprises a drum for holding an image recording medium attached to a surface thereof; a rotating device for rotating said drum; grooves formed in the surface of said drum; a negative pressure generating device for generating a negative pressure in said grooves by communicating with said grooves and sucking air; an image recording device for emitting a light beam modulated by image signals; and a gas blowoff device for blowing a gas current to blow away, in a predetermined direction, a gas generated by irradiation with said light beam; wherein said grooves form closed regions covered by said image recording medium when said image recording medium is attached, and unclosed regions not covered by said image recording medium; and a relative positional relationship of a gas blowing direction from said gas blowoff device, extending directions of said grooves and an attaching position of said image recording medium is determined so that said unclosed regions constantly exist only further upstream of the gas current from said gas blowoff device than a position of irradiation with said light beam.

The image recording apparatus set out in claim 2 is the invention set out in claim 1, wherein said drum is capable of holding at least two types of different size image recording media attached to the surface thereof, an attachment reference position being defined on the surface of said drum for use as a reference for attaching the at least two types of different size image recording media; and a relative positional relationship of the gas blowing direction from said gas blowoff device, the extending directions of said grooves and said attachment reference position is determined so that said unclosed regions constantly exist only further upstream of the gas current from said gas blowoff device than the position of irradiation by said light beam.

The image recording apparatus set out in claim 3 is the invention set out in claim 1, wherein said grooves and said negative pressure generating device communicate through suction bores formed in inner surfaces of the grooves, each of the suction bores being formed in said closed region of each groove.

The image recording apparatus set out in claim 4 is the invention set out in claim 3, wherein said suction bores are formed in positions the most downstream in the gas blowing direction of each of said grooves, and in regions outside a region for image recording by said image recording device.

The image recording apparatus set out in claim 5 is the invention set out in claim 4, wherein said image recording device further includes a secondary scanning device to be movable along an axis of rotation of said drum synchronously with rotation of said drum; and said gas blowoff device is a device for blowing away said gas upstream in a direction of rotation of said drum.

The image recording apparatus set out in claim 6 is the invention set out in claim 4, wherein said image recording device further includes a secondary scanning device to be movable along an axis of rotation of the drum synchronously with rotation of said drum; and said gas blowoff device is a device for blowing away said gas downstream in a direction of movement of said image recording device caused by said secondary scanning device.

The image recording apparatus set out in claim 7 is the invention set out in claim 3, wherein an image-recordable region of the image recording medium attached to said drum is set to a position shifted in the extending directions of said grooves in a primary scanning direction from positions where said suction bores are formed.

Effect Of The Invention

According to the image recording apparatus of this invention, a gas generating from an image recording medium never drifts to the back surface of the image recording medium to deteriorate the quality of a recorded image.

Figure 1:
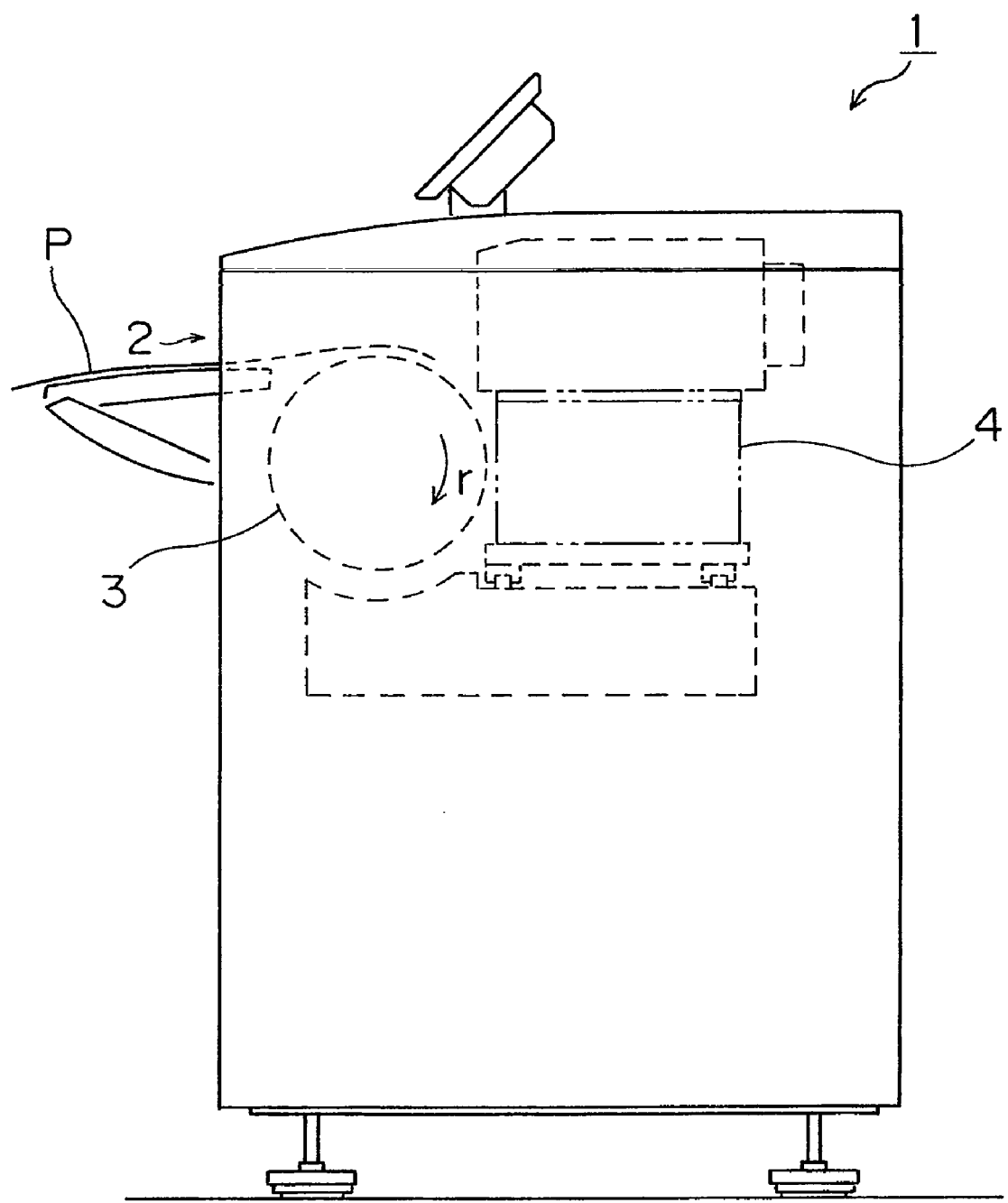
FIG. 1 is a see-through side view of an image recording apparatus 1.

DESCRIPTION OF REFERENCES 1 image recording apparatus
2 opening
3 drum
4 recording head
31 drum surface
32 rear end tape
41 housing
42 laser light source
43 lens
44 air blowoff pipe
45 case
46 gas suction pipe
100 brush
H suction bores
L suction grooves
P flexo-digital plate
G gas
EP laser irradiation point

BEST MODE FOR CARRYING OUT THE INVENTION

FIG. 1 is a see-through side view of an image recording apparatus 1 which records an image on a flexo-digital plate P.

As shown in FIG. 1, this image recording apparatus 1 includes a drum 3 for holding the flexo-digital plate P (hereinafter abbreviated as plate P), and a recording head 4 for recording an image on the plate P. The drum 3 is a hollow cylindrical member having an inner chamber. The inner chamber is connected through piping to a vacuum pump, not shown, disposed outside the drum 3.

An unexposed plate P is introduced from outside through an opening 2 into the image recording apparatus 1, and is wrapped around the drum 3. The drum 3 is rotatable in the direction of arrow r by a rotating mechanism not shown. The recording head 4 is disposed opposite the drum 3, and is movable along the axis of rotation of the drum 3. Thus, the surface of plate P undergoes primary scanning action when the drum 3 is rotated while laser light modulated by image signals is emitted from the recording head 4 toward the surface of plate P. The surface of plate P undergoes secondary scanning action when the recording head 4 is moved along the axis of rotation of the drum 3 synchronously with rotation of the drum 3. In the following description, the scanning directions will be referred to as secondary scanning direction X and primary scanning direction Y.

Figure 2:
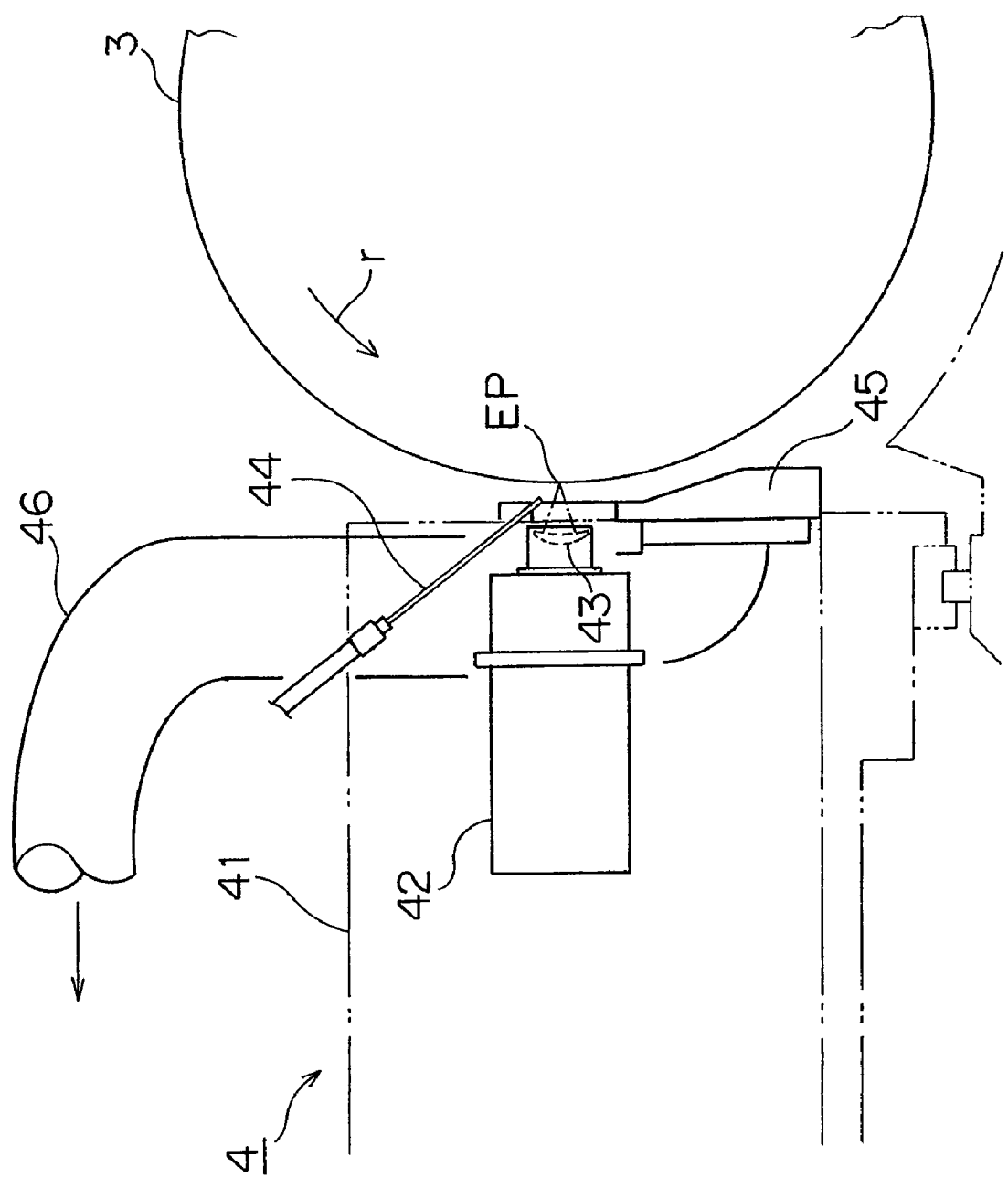
FIG. 2 is a side view showing an outline of a recording head 4.
Figure 3:
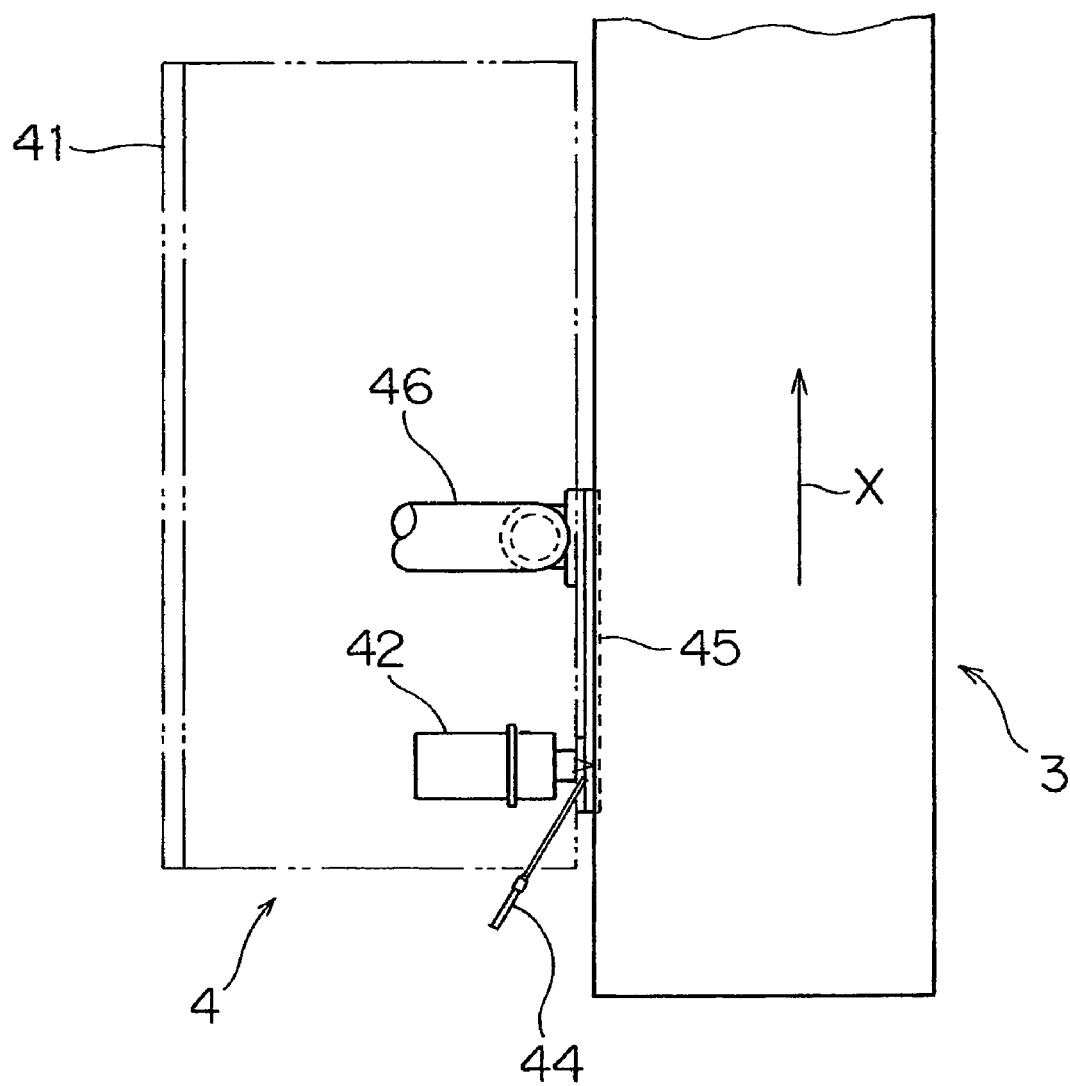
FIG. 3 is a top view of the recording head 4 and a drum 3.
Figure 4:
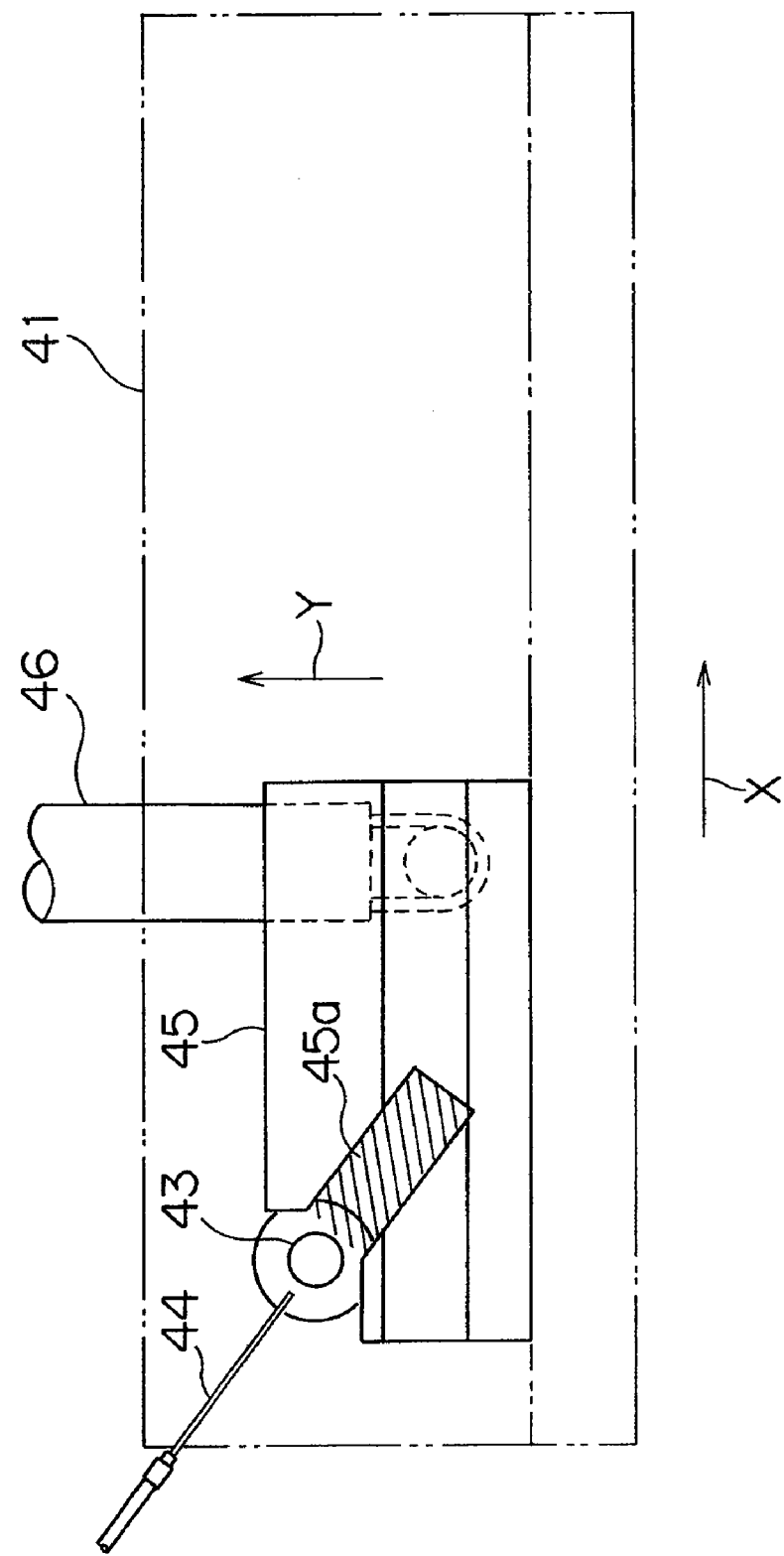
FIG. 4 is a front view of the recording head 4 seen from the drum 3.

The construction of the recording head 4 will be described with reference to FIGS. 2 through 4. FIG. 2 is a side view showing an outline of the recording head 4. FIG. 3 is a top view of the recording head 4 and drum 3. FIG. 4 is a front view of the recording head 4 seen from the drum 3.

As shown in FIG. 2, the recording head 4 includes a housing 41 with a laser source 42 mounted therein for emitting laser light. The laser light emitted from the laser source 42, with the action of a lens 43, forms an image at a point EP on the surface of the drum 3 (actually, on the plate P wrapped around the drum 3). When the plate P is irradiated with the laser light, gas and dust will be generated. In order to dispose of the gas and the like, an air blowoff pipe 44, a case 45 and a gas suction pipe 46 are arranged on the front of the housing 41.

The air blowoff pipe 44 is disposed above the laser source 42, that is downstream of the laser source 42 in the primary scanning direction Y, as shown in FIG. 2, and upstream in the secondary scanning direction X, as shown in FIG. 4, for blowing high-speed air purified by a filter toward the laser irradiation point EP. This produces an airflow in a direction turned approximately 45 degrees clockwise from the primary scanning direction Y in FIG. 4, which blows away the gas and the like generating from the plate P.

The case 45 is a box-like member which prevents spread of the diffused gas, and has an opening formed in a part of its surface opposed to the drum 3. That is, the hatched portion 45a in FIG. 4 is the opening of the case 45.

The gas suction pipe 46 is connected to the case 45 in a position thereof downstream in the secondary scanning direction X.

Figure 5:
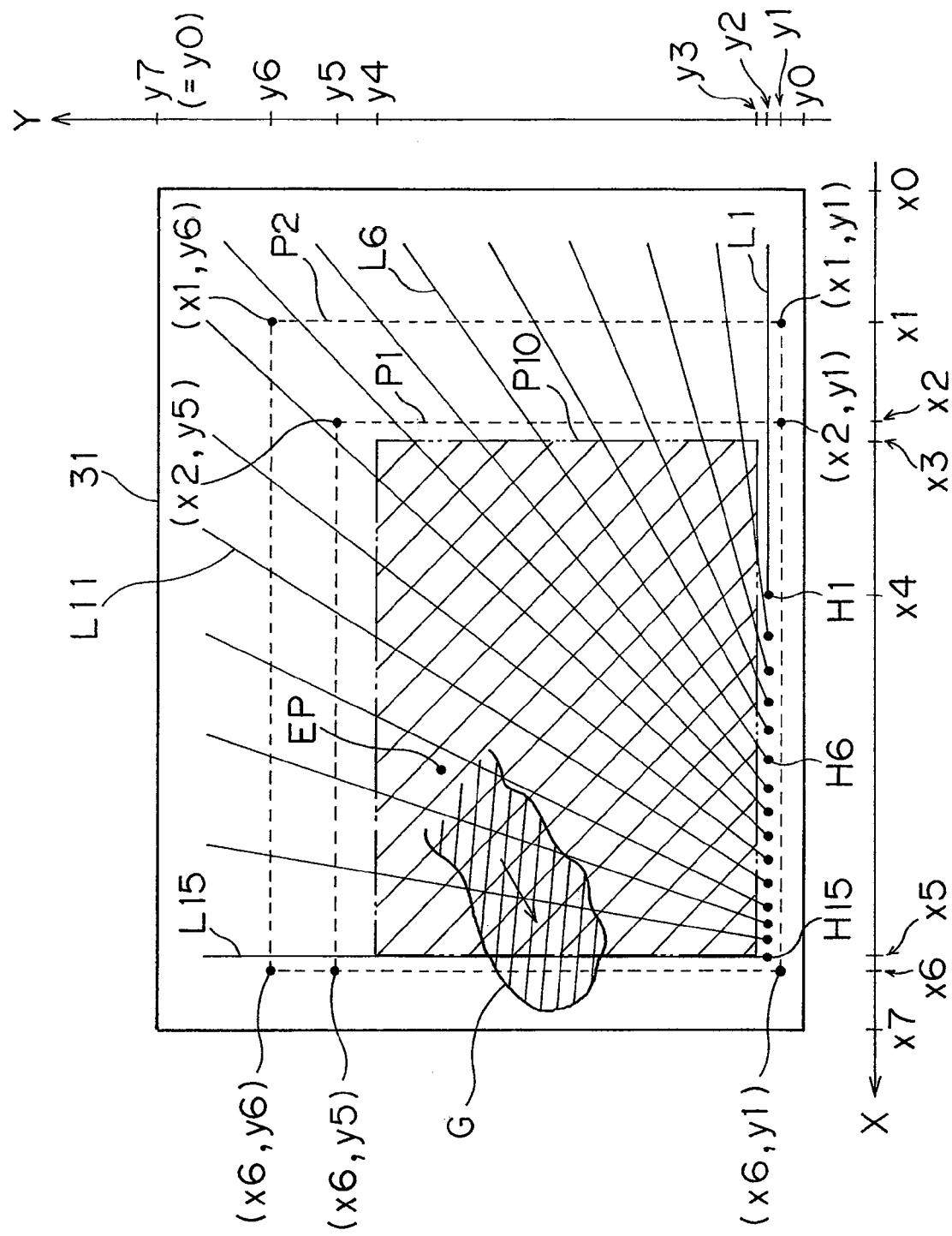
FIG. 5 is a developed view of a drum surface 31.

Directions and positions of suction grooves formed in the surface 31 of the drum 3 will be described with reference to FIG. 5. FIG. 5 is a developed view of the surface 31 of the drum 3. FIG. 5 shows, for reference, an X-axis of coordinates corresponding to the secondary scanning direction X, and a Y-axis of coordinates corresponding to the primary scanning direction Y. In FIG. 5, the arrow of the X-axis of coordinates indicates downstream in the secondary scanning direction X, while the arrow of the Y-axis of coordinates indicates downstream in the primary scanning direction Y.

Different size plates P can be mounted on the surface 31 of the drum 3. FIG. 5 shows two plates, i.e. a small size plate P1 and a large size plate P2, by way of example. The small plate P1 is a rectangle having vertices at point (x2, y1), point (x2, y5), point (x6, y5) and point (x6, y1). The large plate P2 is a rectangle having vertices at point (x1, y1), point (x1, y6), point (x6, y6) and point (x6, y1).

In order to attach such different size plates P, 15 suction grooves L1-L15 are formed in the drum surface 31 to have different angles of inclination relative to the secondary scanning direction X. These suction grooves L1-L15 extend from different positions in the secondary scanning direction X, but from the same position in the primary scanning direction Y (X coordinates: between position x4 and position x5 inclusive; Y coordinates: position y2). The suction grooves L1-L15 have suction bores H1-H15 formed in predetermined bottom positions thereof, respectively, for communication with the inner chamber of the drum 3. In FIG. 5, the reference signs of suction grooves L2-L5, L7-L10 and L12-L14 and suction bores H2-H5 and H7-H14 are omitted to avoid complication of the illustration.

The suction groove L1 extends parallel to the secondary scanning direction X. The suction bore H1 is formed in the position, the most downstream in the secondary scanning direction X, of the suction groove L1.

The suction groove L6 extends in a direction inclined approximately 45 degrees counterclockwise relative to the secondary scanning direction X. The suction bore H6 is formed in the position, the most downstream in the secondary scanning direction X, of the suction groove L6.

The suction groove L15 extends parallel to the primary scanning direction Y.

The suction grooves L2-L13 other than the suction groove L1 and suction groove L15 are formed to incline at different angles relative to the secondary scanning direction X, respectively. The suction bores H2-H13 are formed in the positions, the most upstream in the primary scanning direction Y, i.e. the nearest to origin y0 of the primary scanning direction Y, of the respective suction grooves L2-L13.

Next, attachment of plate P on the drum surface 31 will be described. The position of coordinates (x6, y1) is used as reference for attaching any size plate P to the drum surface 31. Thus, the lower left point of plate P is common to all plate sizes, and an increase in the plate size entails an enlargement in the direction—X counter to the secondary scanning direction X or in the primary scanning direction Y. The coordinates (x6, y1) are called a reference position for attaching plates P.

By attaching a plate P to the drum surface 31, part of the suction grooves L1-L15 are closed by the plate P, but the other parts remain unclosed by the plate P. Gas and the like can drift through the parts of the suction grooves L1-L15 not closed by the plate P (hereinafter called the unclosed regions of the suction grooves) to the back surface of the plate P and contaminate this back surface. With a certain type of image recording medium, e.g. the flexo-digital plate described in this embodiment, such contamination of the back surface may deteriorate the quality of recorded images. Specifically, numerous reliefs are formed on the surface of the flexo-digital plate in the making of the flexo-digital plate, and the shapes of the reliefs may become inaccurate when the back surface of the plate is contaminated. This phenomenon will be described with reference to FIGS. 13 through 18 which are explanatory views of steps of making the flexo-digital plate shown in FIG. 12 which is a type of letterpress plate.

Figure 12:
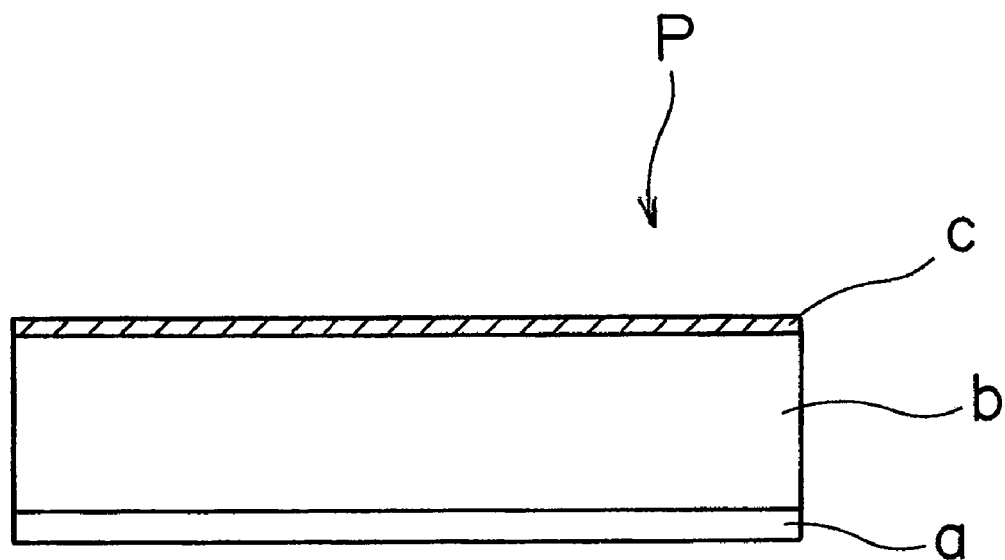
FIG. 12 is an explanatory view of a flexo-digital plate.
Figure 13:
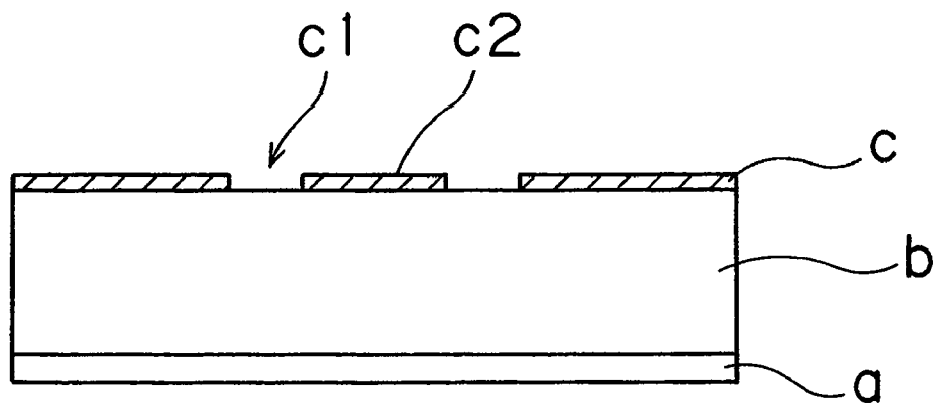
FIG. 13 is an explanatory view of a step of making the flexo-digital plate.

As shown in FIG. 12, the flexo-digital plate has a sectional structure having the back surface of a photosensitive resin layer b coated with a base film a, and the front surface with a black mask layer c. By irradiating the front surface of such plate P with laser light modulated by image signals, the black mask layer c is selectively ablated as shown in FIG. 13 (image recording step). At this time, gas and dust are generated. Reference c1 indicates ablated parts of the black mask layer c, and reference c2 non-ablated parts.

Figure 14:
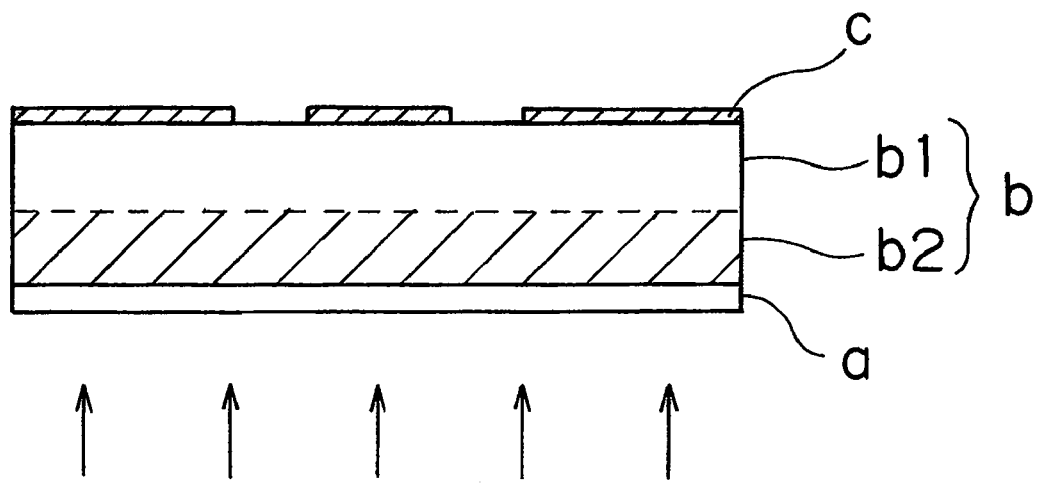
FIG. 14 is an explanatory view of a step of making the flexo-digital plate.

Next, as shown in FIG. 14, UV light is emitted uniformly to the back surface of plate P (back exposure step). As a result, the photosensitive resin layer b hardens to a predetermined depth. Reference b1 is affixed to a hardened portion, and reference b2 to an unhardened portion.

Figure 15:
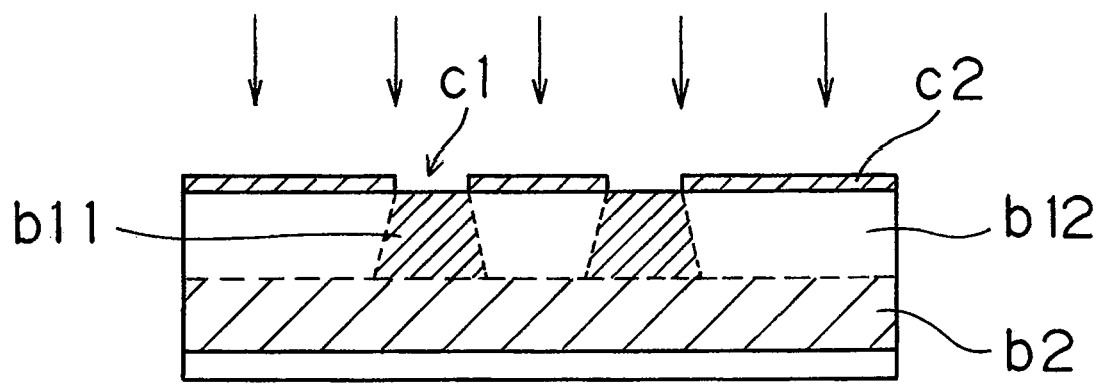
FIG. 15 is an explanatory view of a step of making the flexo-digital plate.

Next, as shown in FIG. 15, UV light is emitted uniformly to the front surface of plate P (main exposure step). As a result, portions b11 of the photosensitive resin layer b located under the abladed parts c1 ablaided in the image recording step are hardened by the UV light. On the other hand, due to the light-shielding action of the black mask layer c, the UV light does not reach portions b12 of the photosensitive resin layer b located under the non-ablated parts c2, and thus these portions do not harden.

Figure 16:
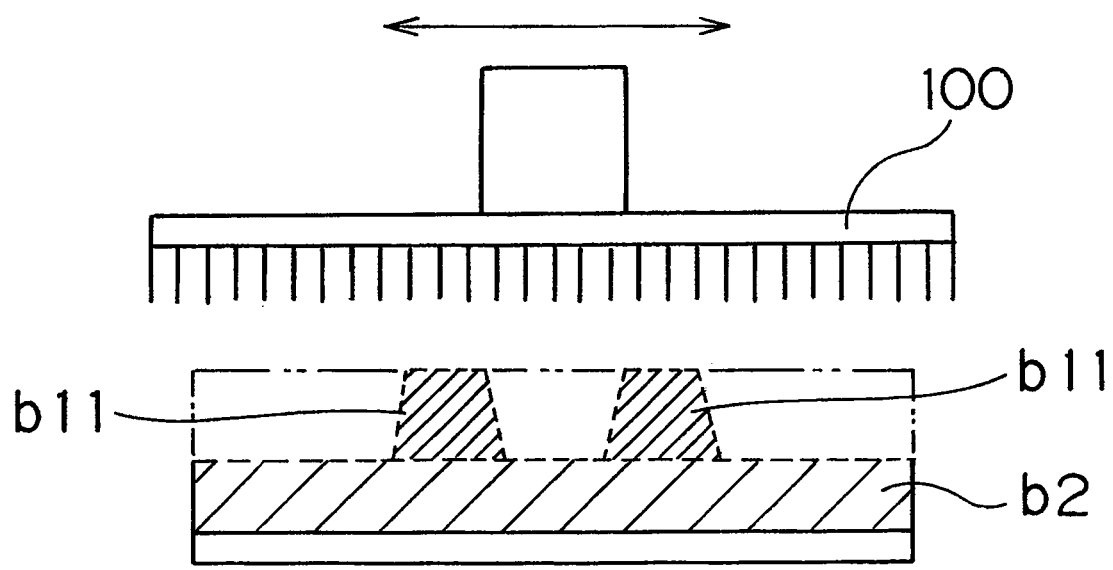
FIG. 16 is an explanatory view of a step of making the flexo-digital plate.
Figure 17:
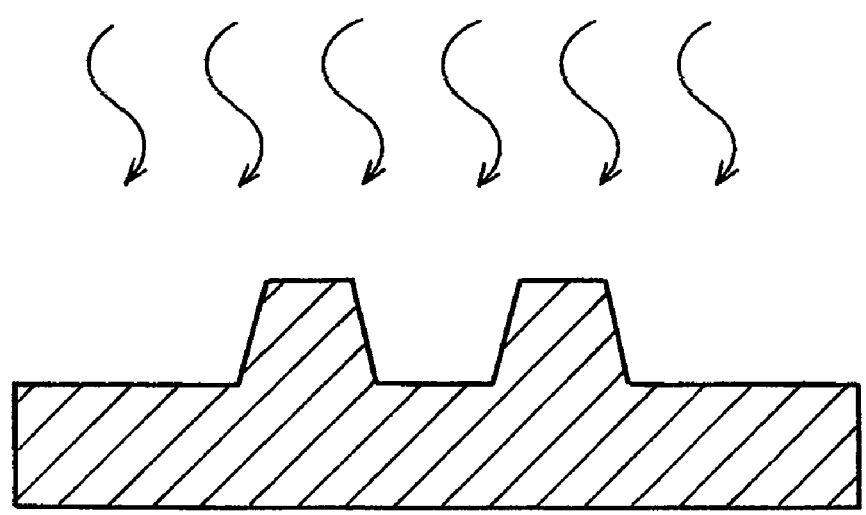
FIG. 17 is an explanatory view of a step of making the flexo-digital plate.
Figure 18:
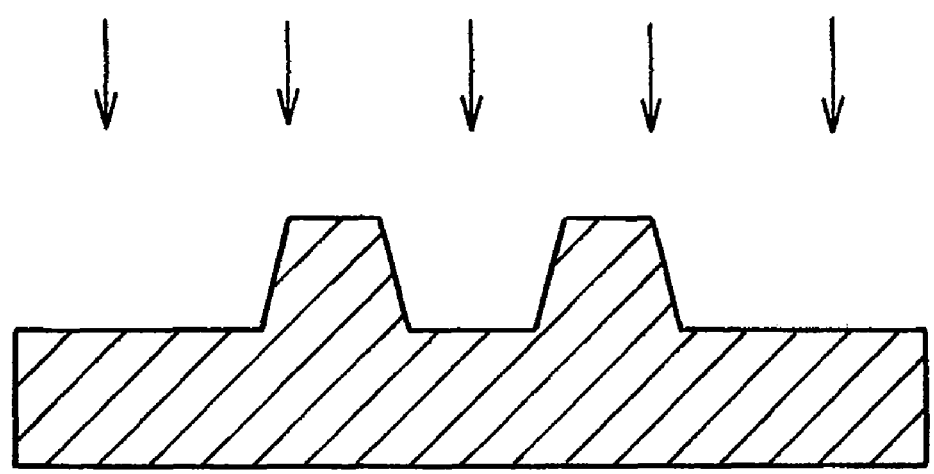
FIG. 18 is an explanatory view of a step of making the flexo-digital plate.

Next, as shown in FIG. 16, the front surface of plate P is cleaned with a cleaning liquid and a brush 100 (washing-out step). This removes the unhardened portions b12 other than the photosensitive resin layer b2 hardened in the back exposure step (see FIG. 14) and the photosensitive resin layer b11 hardened in the main exposure step (see FIG. 15). As a result, a plurality of reliefs b11 appear on the front surface of plate P.

Subsequently, a drying step (FIG. 17) and a post-exposure step (FIG. 18) for emitting UV light to the front surface again are executed to complete the making of plate P.

Assume here that the back surface of plate P is contaminated by the gas in the image recording step. Then, although the part b2 of the photosensitive resin layer b hardens in the back exposure step carried out after the image recording step, UV light does not fully reach the photosensitive resin layer b2 in positions opposite the contaminated locations. Therefore, the photosensitive resin layer b2 in the positions opposite the contaminated locations does not fully harden. Since such unhardened portions do not have the hardness they should have in a normal situation, they cannot fully withstand the washing-out in the subsequent washing-out step using the brush 100 or the like. Therefore, the relief structure appearing on the front surface of plate P after the washing-out step fails to have an accurate shape. That is, a recorded image will deteriorate.

Although the greater part of the gas produced by laser irradiation in the image recording step (FIG. 12) is captured in the above-mentioned case 45 and sucked by the gas suction pipe 46, part thereof may not be captured in the case 45. Such gas is driven upstream in the primary scanning direction and downstream in the secondary scanning direction by the air blown from the air blowoff pipe 44. That is, as schematically shown in FIG. 5, the gas G generating from the laser irradiation point EP is driven, along the drum surface 31, upstream in the primary scanning direction and downstream in the secondary scanning direction. The laser irradiation point EP is an arbitrary point in an image-recordable region of the plate P.

The drift of the gas to the back surface of plate P takes place when the gas enters from the unclosed region of each suction groove L. As seen from FIG. 5, the gas does not flow in the portions not covered by the plate P1 of the grooves L11-L15 adjacent the laser irradiation point EP. It is therefore possible to prevent drifting of gas G to the back surface of the plate.

Figure 6:
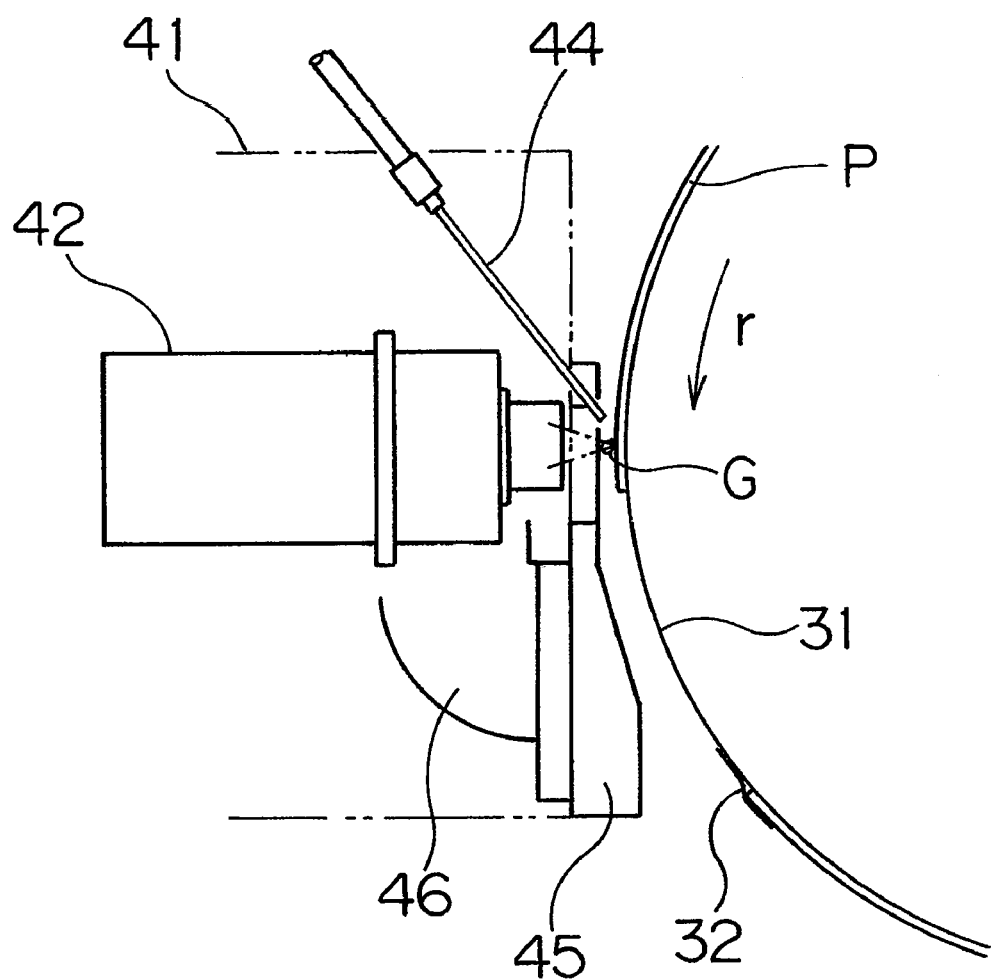
FIG. 6 is an explanatory view showing a moving state of gas G when laser is emitted near a forward end of a plate P.
Figure 7:
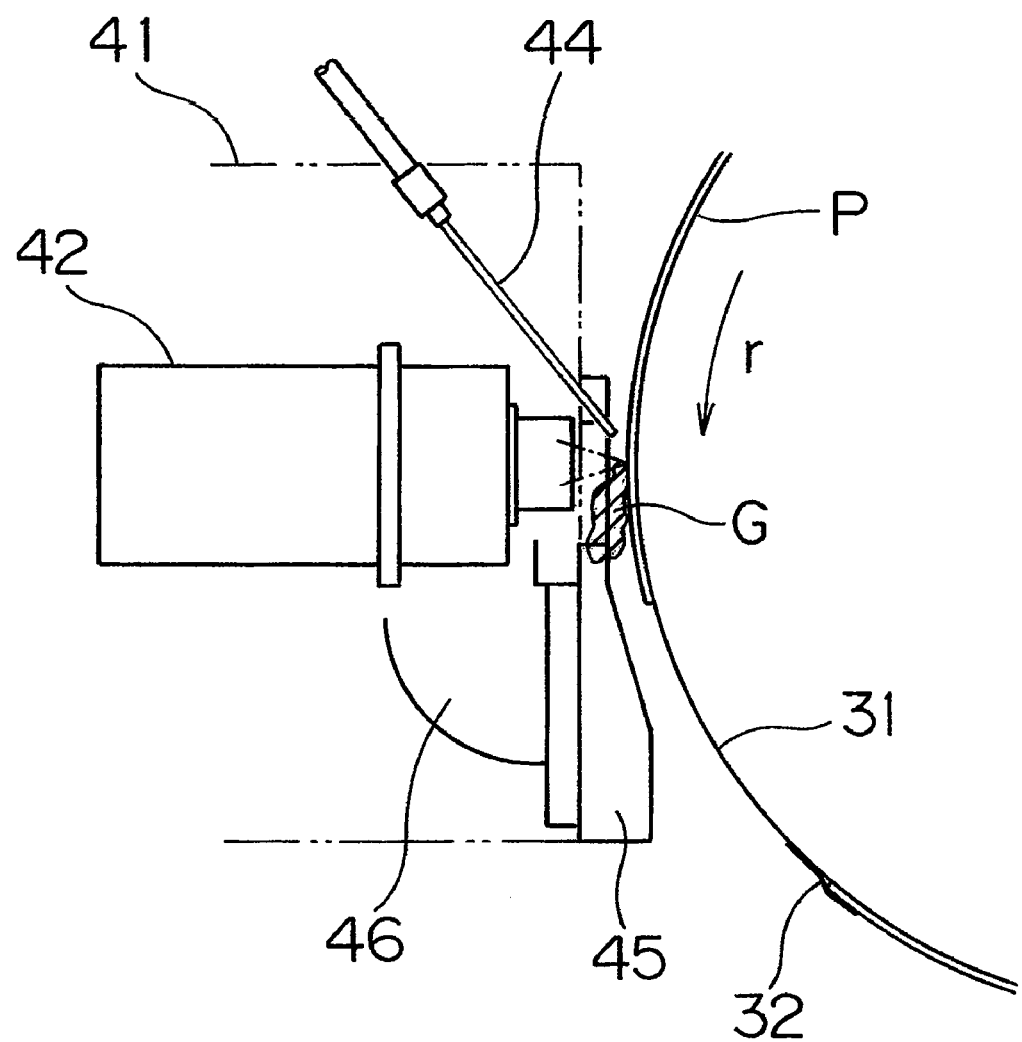
FIG. 7 is an explanatory view showing a moving state of gas G when laser is emitted near the forward end of the plate P.
Figure 8:
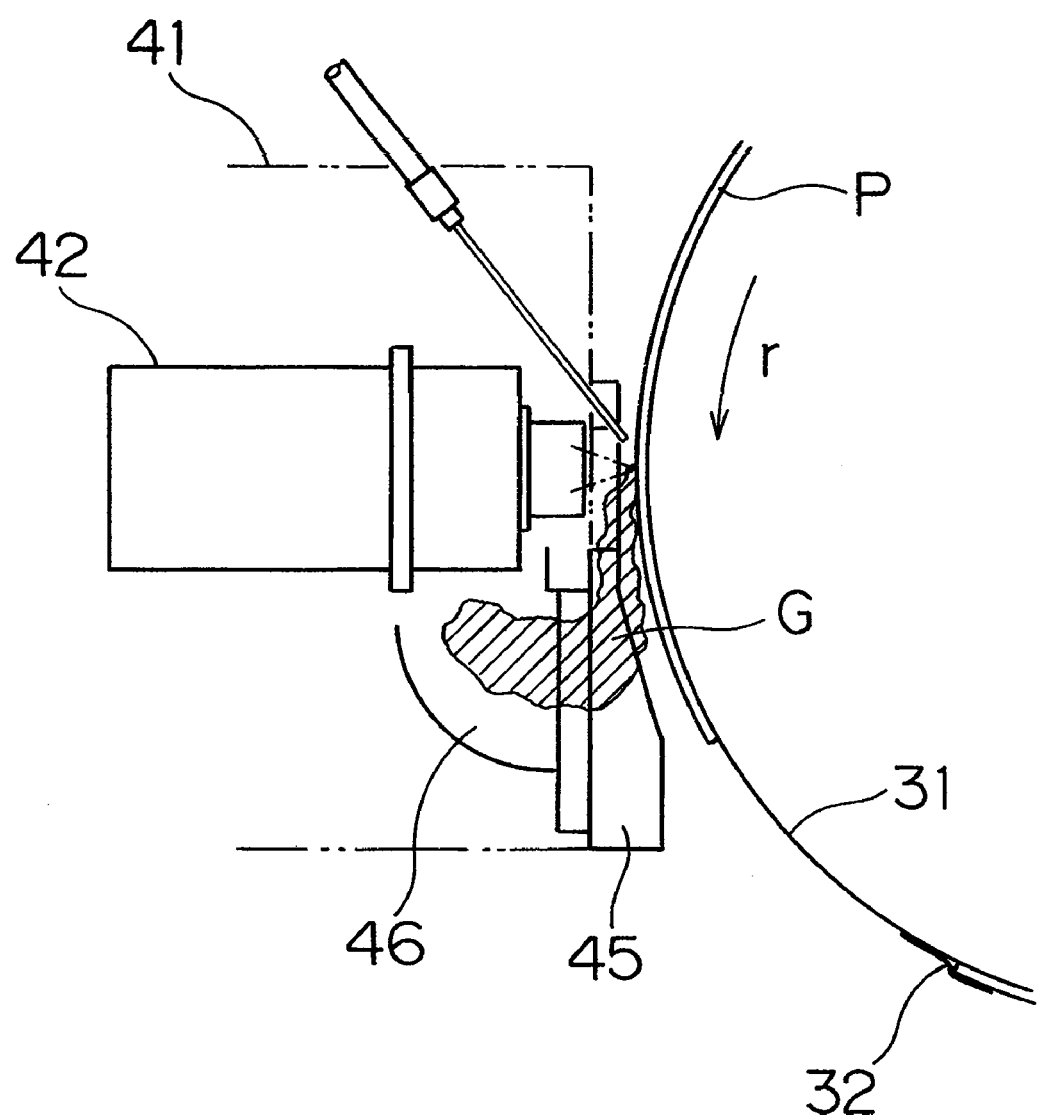
FIG. 8 is an explanatory view showing a moving state of gas G when laser is emitted near the forward end of the plate P.

FIGS. 6 through 8 are explanatory views showing moving states of gas G at a time of starting the image recording. FIG. 6 shows a state immediately after starting laser exposure of the forward end of plate P. FIG. 7 shows a state where the image recording advances and the amount of emergence of gas G is increasing with rotation of the drum 3. FIG. 8 shows a state where the image recording advances and a fixed quantity of gas G is generating constantly.

As shown in FIG. 6, the image recording is started at the forward end of plate P wound around the drum 3, i.e. in a position near the boundary with the unclosed regions of the suction grooves L1-L15 on the drum surface 31. Since the amount of emergence of gas G is small immediately after the start of laser exposure, the gas G does not spread to the unclosed regions.

As shown in FIG. 7, the amount of emergence of gas G increases with progress of the image recording. However, with the rotation in the direction r of the drum 3, the forward end of plate P passes through areas forward of the case 45 before movement of gas G. Thus, as shown in FIG. 8, the gas G having generated is captured in the case 45 before arriving at the unclosed regions on the drum surface 31. Therefore, the gas G does not move to the back surface of plate P from each groove in the unclosed region.

Figure 9:
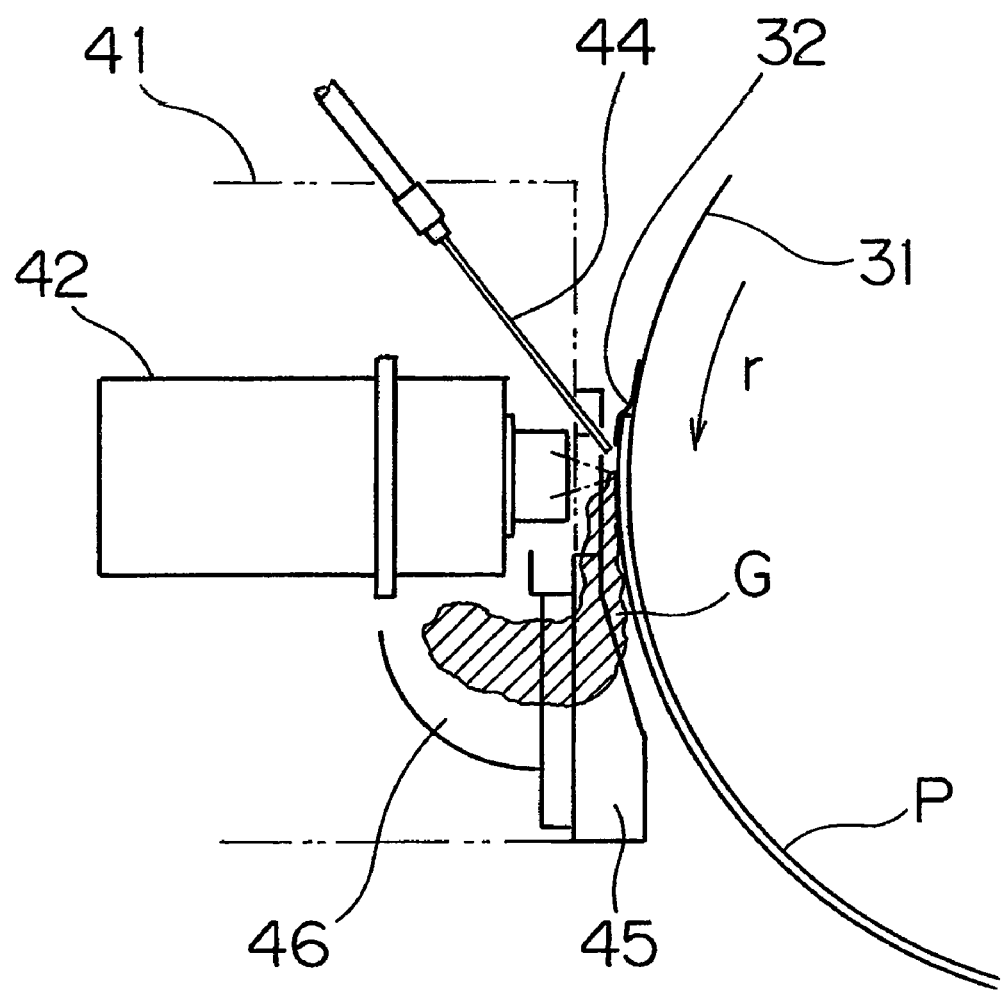
FIG. 9 is an explanatory view showing a moving state of gas G when laser is emitted near a rear end of the plate P.
Figure 10:
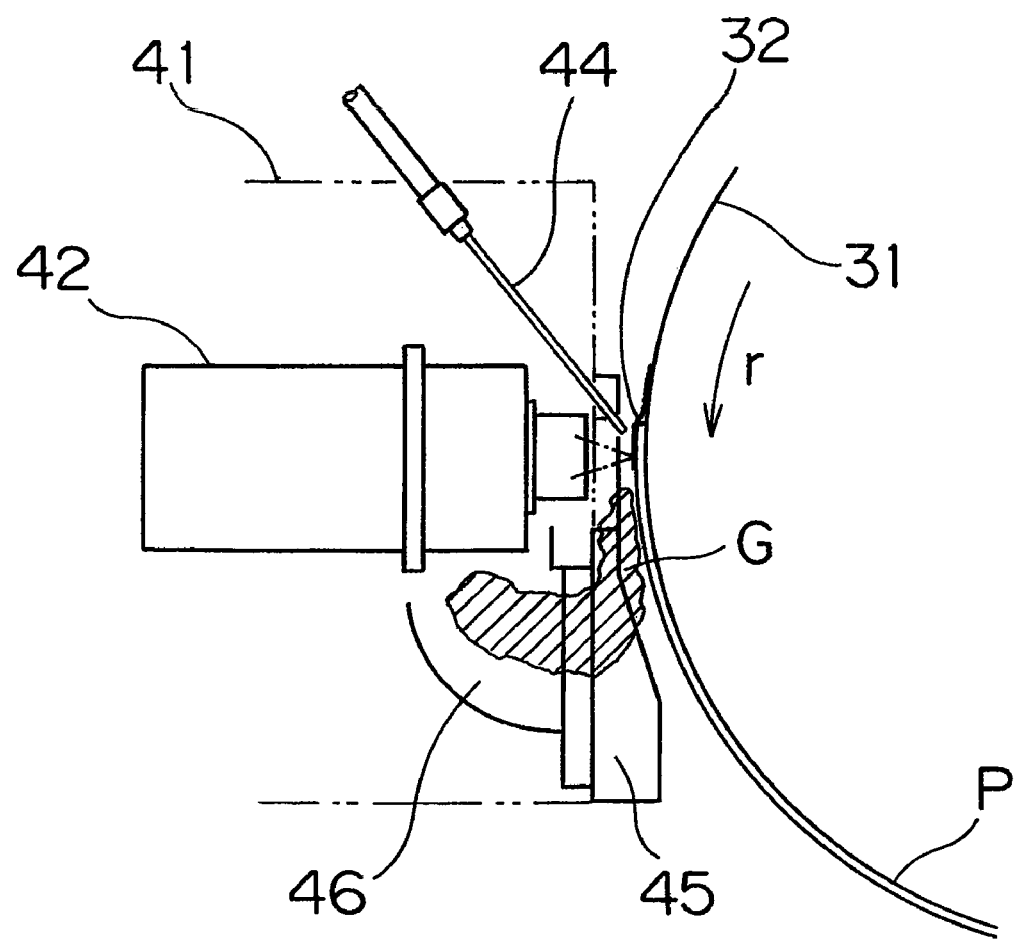
FIG. 10 is an explanatory view showing a moving state of gas G when laser is emitted near the rear end of the plate P.
Figure 11:
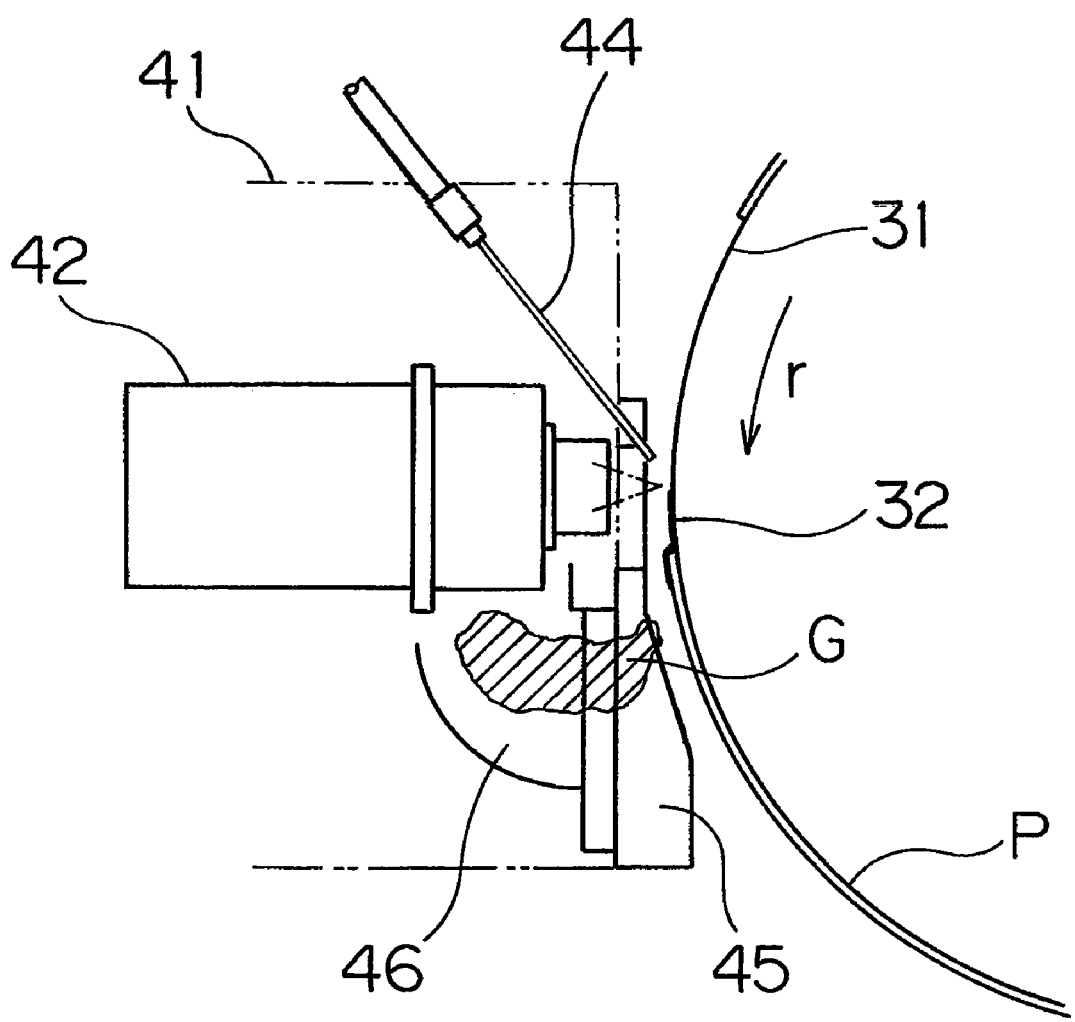
FIG. 11 is an explanatory view showing a moving state of gas G when laser is emitted near the rear end of the plate P.

FIGS. 9 through 11 are explanatory views showing moving states of gas G at a time of finishing the image recording. FIG. 9 shows a state immediately before finishing laser exposure of the rear end of plate P. FIG. 10 shows a state immediately after finishing the exposure of the plate P. FIG. 11 shows a state where the drum 3 has further rotated after the end of the laser exposure.

As shown in FIG. 9, the rear end of plate P is located upstream with respect to the flowing direction of the gas G. The rear end of plate P is fixed with a fixing tape 32 or the like. As shown in FIGS. 10 and 11, a new generation of gas G stops upon completion of the laser exposure. By the time the rear end of plate P passes the laser irradiation point with rotation in the direction r of the drum 3, the gas G which existed between the drum 3 and laser source 42 has been captured in the case 45 and sucked by the gas suction pipe 46.

When the moving distance of gas G is slower than the rotating speed of the drum 3 at this time, each suction groove in the unclosed region adjacent the rear end of plate P will pass through the gas G generated near the rear end of plate P, and the gas G will be drawn into the suction grooves.

Since the moving speed of the gas is about 10 m/s according to a simulation, the rotation moving speed of the drum 3 is set to about 2.2 m/s in this embodiment. Thus, when the moving speed of the gas is greater than the moving speed of the drum, the gas G will be drawn into the gas suction pipe 46 before each suction groove constituting the unclosed region adjacent the rear end of plate P passes through the gas G produced near the rear end of plate P. Therefore, the gas G will not drift to the back surface of plate P.

In this embodiment, a relative positional relationship of the air blowing direction from the air blowoff pipe 44, the extending directions of grooves L1-L15 and the attaching origin of the plate P is determined so that the unclosed regions of all the suction grooves L1-L15 exist only further upstream in the gas moving direction than the laser irradiation point EP.

The image-recordable region differs for each plate size. The image-recordable region P10 of the small size plate P1 is different from that (not shown) of the large size plate P2, and the latter is the larger. However, the image-recordable region of each plate size is set to a position shifted in the primary scanning direction Y from the suction bores H1-H15.

For example, the image-recordable region of the small size plate P1 is the region affixed with reference P10.

The speed of air currents flowing through the suction groove L becomes a maximum adjacent the suction bores H. It is thought, therefore, that the portions of the back surface of plate P opposed to the suction bores H are the most contaminated by the gas. Contamination of the back surface of plate P due to the gas blowing into the suction bores H can be prevented by setting the image-recordable region of each plate size to a position shifted from the suction bores H1-H15 as described in this embodiment.

Industrial Utility

The invention is applicable to platemaking using not only an image recording medium for forming reliefs by irradiating its front surface with light to produce photo-curing action, but also an image recording medium for forming reliefs by irradiating both the front surface and back surface.

The invention claimed is:

1. An image recording apparatus comprising:
   a drum for holding an image recording medium attached to a surface thereof;
   a rotating device for rotating said drum;
   grooves formed in the surface of said drum;
   a negative pressure generating device for generating negative pressure in said grooves by communicating with said grooves and sucking air;
   an image recording device for emitting a light beam modulated by image signals; and
   a gas blowoff device for blowing a gas current to blow away, in a predetermined direction, a gas generated by irradiation with said light beam,
   wherein:
   said drum is configured to mount, on the surface thereof, at least two types of rectangle image recording media of different sizes;
   an attachment reference position is defined on the surface of said drum for use as a position for arranging one of vertices of the rectangles of the at least two types of rectangle image recording media of different sizes and as a reference for attaching the at least two types of rectangle image recording media of different sizes;
   said grooves form closed regions covered by said image recording medium when said image recording medium is attached, and unclosed regions not covered by said image recording medium;
   a relative positional relationship of a gas blowing direction from said gas blowoff device, extending directions of said grooves, and an attaching position of said image recording medium is determined so that said unclosed regions constantly exist only further upstream of the gas current from said gas blowoff device than a position of irradiation with said light beam;

said grooves and said negative pressure generating device communicate through suction bores formed in inner surfaces of the grooves, each of the suction bores being formed in said closed region of each groove; and said suction bores are formed in positions the most downstream in the gas blowing direction of each of said grooves, and in regions outside a region for image recording by said image recording device.

2. The image recording apparatus according to claim 1, wherein: said image recording device further includes a secondary scanning device to be movable along an axis of rotation of said drum synchronously with rotation of said drum; and said gas blowoff device is a device for blowing away said gas upstream in a direction of rotation of said drum.

3. The image recording apparatus according to claim 1, wherein:

said image recording device further includes a secondary scanning device to be movable along an axis of rotation of the drum synchronously with rotation of said drum; and said gas blowoff device is a device for blowing away said gas downstream in a direction of movement of said image recording device caused by said secondary scanning device.

4. An image recording apparatus comprising:

a drum for holding an image recording medium attached to a surface thereof;

a rotating device for rotating said drum;

grooves formed in the surface of said drum;

a negative pressure generating device for generating negative pressure in said grooves by communicating with said grooves and sucking air;

an image recording device for emitting a light beam modulated by image signals; and a gas blowoff device for blowing a gas current to blow away, in a predetermined direction, a gas generated by irradiation with said light beam, wherein:

said drum is configured to mount, on the surface thereof, at least two types of rectangle image recording media of different sizes;

an attachment reference position is defined on the surface of said drum for use as a position for arranging one of vertices of the rectangles of the at least two types of rectangle image recording media of different sizes and as a reference for attaching the at least two types of rectangle image recording media of different sizes;

said grooves form closed regions covered by said image recording medium when said image recording medium is attached, and unclosed regions not covered by said image recording medium;

a relative positional relationship of a gas blowing direction from said gas blowoff device, extending directions of said grooves, and an attaching position of said image recording medium is determined so that said unclosed regions constantly exist only further upstream of the gas current from said gas blowoff device than a position of irradiation with said light beam;

said grooves and said negative pressure generating device communicate through suction bores formed in inner surfaces of the grooves, each of the suction bores being formed in said closed region of each groove; and an image-recordable region of the image recording medium attached to said drum is set to a position shifted in the extending directions of said grooves in a primary scanning direction from positions where said suction bores are formed.

5. An image recording apparatus comprising:

a drum for holding an image recording medium attached to a surface thereof;

a rotating device for rotating said drum;

grooves formed in the surface of said drum;

a negative pressure generating device for generating negative pressure in said grooves by communicating with said grooves and sucking air;

an image recording device for emitting a light beam modulated by image signals; and a gas blowoff device for blowing a gas current to blow away, in a predetermined direction, a gas generated by irradiation with said light beam, wherein:

said drum is configured to mount, on the surface thereof, at least two types of rectangle image recording media of different sizes;

an attachment reference position is defined on the surface of said drum for use as a position for arranging one of vertices of the rectangles of the at least two types of rectangle image recording media of different sizes and as a reference for attaching the at least two types of rectangle image recording media of different sizes;

said grooves form closed regions covered by said image recording medium when said image recording medium is attached, and unclosed regions not covered by said image recording medium;

a relative positional relationship of a gas blowing direction from said gas blowoff device, extending directions of said grooves, and an attaching position of said image recording medium is determined so that said unclosed regions constantly exist only further upstream of the gas current from said gas blowoff device than a position of irradiation with said light beam;

wherein:

said image recording device further includes a secondary scanning device configured to move along an axis of rotation of said drum synchronously with rotation of said drum; and said grooves are formed in the surface of said drum to extend from different positions in a secondary scanning direction but from the same position in a primary scanning direction, and to have different angles of inclination relative to the secondary scanning direction.

6. The image recording apparatus according to any one of claim 1, 4, or 5, wherein said image recording medium is flexo-digital plate.

* * * * *